United States Patent [19]

Sokoloski et al.

[11] 4,323,910
[45] Apr. 6, 1982

[54] MNOS MEMORY TRANSISTOR

[75] Inventors: Joseph C. Sokoloski, East Brunswick; Alfred C. Ipri, Princeton, both of N.J.

[73] Assignee: RCA Corporation, New York, N.Y.

[21] Appl. No.: 855,087

[22] Filed: Nov. 28, 1977

[51] Int. Cl.³ .............................................. H01L 29/80
[52] U.S. Cl. ....................................... 357/23; 357/13; 357/54; 365/184
[58] Field of Search ........................... 357/13, 23, 54; 307/238; 305/184

[56] References Cited

U.S. PATENT DOCUMENTS

| | | | |
|---|---|---|---|
| T954,008 | 1/1977 | Baitinger et al. | 357/23 |
| 3,660,819 | 5/1972 | Frohman-Bentchkowsky | 357/23 |
| 3,738,880 | 6/1973 | Laker | 357/59 |
| 3,836,894 | 9/1974 | Cricchi | 365/184 |
| 3,889,287 | 6/1975 | Powell | 365/184 |
| 3,893,152 | 7/1975 | Lin | 365/184 |
| 3,931,632 | 1/1976 | Uchida et al. | 365/184 |
| 4,104,675 | 8/1975 | Dimaria et al. | 357/23 |
| 4,123,771 | 10/1978 | Uchida | 357/23 |

OTHER PUBLICATIONS

J. Wallmark et al., "Switching and Storage Characteristics of Mis Memory Transistors", RCA Review, vol. 30, pp. 335-365, Jun., 1969.

Primary Examiner—Joseph E. Clawson, Jr.
Attorney, Agent, or Firm—Harold Christoffersen; Donald S. Cohen

[57] ABSTRACT

A memory transistor includes a body of semiconductor material having therein a channel region of one conductivity type and source and drain regions of the opposite conductivity type. A channel insulation is on the surface of the semiconductor body and extends over the channel region. The channel insulation includes a first layer of silicon dioxide directly on the surface of the semiconductor body and a layer of silicon nitride on the silicon dioxide layer. A gate of conductive polycrystalline silicon is preferable provided on the channel insulation. The channel of the transistor is sufficiently narrow so that electrons can be avalanched into the interface between the silicon nitride layer and the silicon dioxide layer completely across the full width of the channel where the electrons can be stored.

7 Claims, 4 Drawing Figures

MNOS MEMORY TRANSISTOR

BACKGROUND OF THE INVENTION

The present invention relates to a MNOS memory transistor and particularly to such a transistor which can be written solely using avalanche injection.

MNOS memory transistors using silicon nitride-silicon oxide double dielectric between the channel region and a conductive gate have been proposed, wherein electrons are tunnel injected into the interface between the silicon nitride and silicon dioxide, as described by Wallmark and Scott in the article, "Switching and Storage Characteristics of MOS Memory Transistors," *RCA Review*, Vol. 30, page 335 (1969). However, to achieve tunnel injection of the electrons in such a transistor requires a very thin (less than 50 A) silicon oxide layer, which is difficult to control and reproduce in a production environment.

Another type of memory transistor is the floating gate transistor such as shown in U.S. Pat. No. 3,660,819 to Frohman-Bentchkowsky, entitled FLOATING GATE TRANSISTOR AND METHOD FOR CHARGING AND DISCHARGING SAME, issued May 2, 1972. The floating gate transistor uses avalanche injection to store charge in a floating conductive gate. This type of transistor can use a thicker dielectric layer (500 A to 1000 A). However, since the gate must be maintained floating to store the charge, in the practical use of the transistor in a memory circuit a second gate must be provided over the floating gate to determine whether a charge is being stored in the floating gate. The need of a second gate makes the transistor more complex to manufacture.

SUMMARY OF THE INVENTION

A MNOS memory transistor includes a body of semiconductor material having along a surface thereof a source region, a drain region and a channel region between the source and drain regions. A channel insulation is on the surface of the semiconductor body and extends over the channel region. The channel insulation includes two layers of different material which are capable of storing, at their interface, electrons which are injected into the channel insulation. The channel is sufficiently narrow that the electrons can be injected into the channel region completely across the channel region by avalanche injection.

DETAILED DESCRIPTION OF THE DRAWINGS

Figure 1:
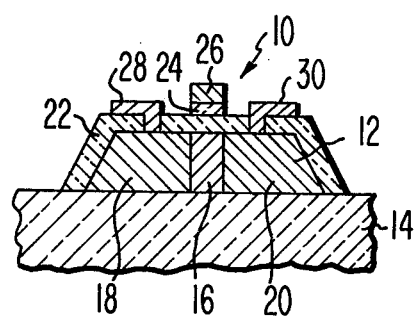
FIG. 1 is a sectional view of a form of the MNOS memory transistor embodying the present invention.

Referring initially to FIG. 1, a form of the MNOS memory transistor embodying the present invention is generally designated as 10. The transistor 10 includes a body 12 of semiconductor material, such as single crystalline silicon, on a substrate 14 of an insulating material, such as sapphire. The semiconductor body 12 includes therein a channel region 16 of one conductivity type between source and drain regions 18 and 20 of the opposite conductivity type. Although the transistor 10 can be either a P channel or N channel transistor, it is preferably a P channel transistor.

On the surface of the semiconductor body 12 is a layer 22 of silicon dioxide. On the silicon dioxide layer 22 is a layer 24 of silicon nitride. As shown, the silicon nitride layer 24 extends across only the channel region 16 of the semiconductor body 12. Thus, the silicon nitride layer 24 and the portion of silicon dioxide layer 22 thereunder form the channel insulation of the transistor 10. The combined thickness of the channel insulation is preferably about 1000 A, with the silicon dioxide layer 22 being of a thickness of no less than 200 A.

A strip 26 of P type polycrystalline silicon is on the silicon nitride layer 24. Conductive source and drain contacts 28 and 30 extend through openings in the silicon oxide layer 22 and contact the source and drain regions 18 and 20, respectively. The source and drain contacts 28 and 30 may be of a metal or of conductive polycrystalline silicon.

In MNOS memory transistor 10, the width of the channel region 16, i.e., the distance across the channel region from the source region to the drain region, and the channel insulation are sufficiently narrow so that when the source and drain junction is avalanched, the junction depletion region extends from the source to the drain across the entire channel region. Hot electrons generated in the depletion region have sufficient energy to enter the silicon dioxide conduction band and reach the interface between the silicon dioxide layer 22 and the silicon nitride layer 24 where the electrons become trapped. By having the channel region narrow, the electrons are distributed across the entire width of the channel region without requiring a conductive floating gate to so distribute the charge. Thus the narrow channel permits the distribution of the electrons across the entire width of the channel insulation by avalanche injection so that a relatively thick channel insulation can be used. The maximum channel width which can be used to achieve this can be determined by the following formula:

$$L_c \leq (\epsilon \Sigma / e\, C_B)$$

where Lc is the channel width, $\epsilon$ is the dielectric constant of the material of the semiconductor body, $\Sigma$ is the critical field value for a material of the semiconductor body, e is the charge on an electron and $C_B$ is the substrate doping concentration. The channel width must be less than or equal to this value to insure current injection (avalanching) along the entire channel and hence insure proper operation of the disclosed invention.

For example, for a transistor 10 in which the semiconductor body 12 is of silicon, $\epsilon$ is 103.43 farads/cm, $\Sigma$ is $4 \times 10^5$ volts/cm and e is $1.6 \times 10^{-19}$ coulombs, if the semiconductor body has a doping concentration of $1 \times 10^{16}$ atoms/cm$^3$ then the channel width Lc, would be equal to or less than $2.6 \times 10^{-4}$ cm. If the semiconductor body has a doping concentration of $1 \times 10^{17}$ atoms/cm then the channel width Lc, should be equal to or less than $2.6 \times 10^{-5}$ cm.

Figure 2:
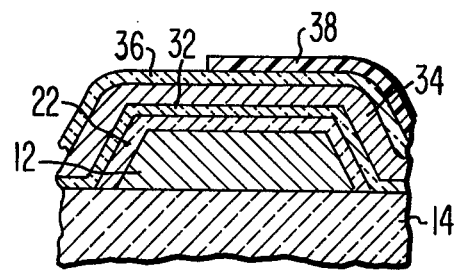
FIGS. 2-4 are sectional views illustrating the steps of making the MNOS memory transistor shown in FIG. 1.

The MNOS transistor 10 may be made by epitaxially depositing a layer of the semiconductor material, such as single crystal silicon on the substrate 14 and removing portions of the semiconductor layer to form the body 12. As shown in FIG. 2, the silicon dioxide layer 22 is then formed on the surface of the semiconductor body 12, such as by oxidizing the surface of the body 12 or by the thermal decomposition of silane in an oxygen atmosphere. A layer 32 of silicon nitride is then deposited on the silicon dioxide layer 22. The silicon nitride layer 32 may be deposited by the thermal decomposition of silane in an ammonia atmosphere. A layer 34 of polycrystalline silicon is then deposited on the silicon nitride layer 32, such as by the thermal decomposition of silane diluted with hydrogen. A masking layer 36 is then coated over the polycrystalline silicon layer 34. The masking layer 36 may be of any material which will not be affected by etchants for the polycrystalline silicon, such as silicon dioxide or silicon nitride. A layer 38 of a photoresist material is then provided on a portion of the masking layer 36 using standard photolithographic techniques. The photoresist layer 38 extends over the portion of the semiconductor body 12 which is to form the channel 16 and either the source region or the drain region. As shown, the photoresist layer is extending over the portion of the semiconductor body 12 which is to provide the drain region as well as the channel region.

Figure 3:
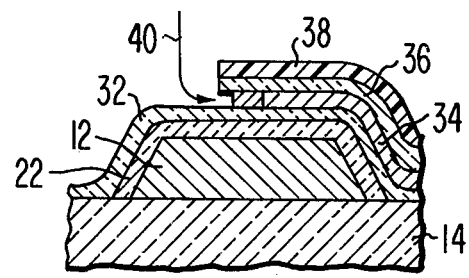

As shown in FIG. 3 the uncovered portion of the masking layer 36 is then removed, such as by etching with a suitable etchant. A masking layer of silicon dioxide can be removed with buffered HF and a masking layer of silicon nitride can be removed with phosphoric acid at about 70° C. This exposes a portion of the polycrystalline silicon layer 34 which is then removed, such as with an anistropic etchant (KOH-H$_2$O). When the polycrystalline silicon layer 34 is etched it will generally undercut the edge of the masking layer 36.

The device is then subjected to a P type dopant and heated. For the P type dopant, boron in the form of diborane may be used as the dopant source. As indicated by the arrow 40 in FIG. 3, the dopant gas will contact the exposed edge of the polycrystalline silicon layer 34 so that the P type dopant will diffuse in the polycrystalline silicon layer laterally therealong from the exposed edge thereof. This diffusion step is carried out long enough to form a P type doped strip of a width equal to the desired width of the channel region. Since the diffusion constant of the dopant is known and the diffusion of the dopant in the polycrystalline silicon layer 34 can be accurately controlled by the time and temperature of the diffusion, the width of the doped strip can be accurately controlled to provide a very narrow width.

Figure 4:
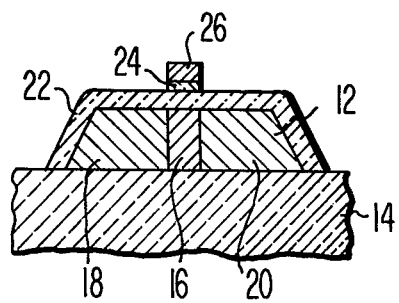

The photoresist layer 36 can then be removed using suitable solvent, and the remaining portion of the masking layer 36 is then removed with a suitable etchant. This exposes both the top surface of the doped portion of the polycrystalline silicon layer and the remaining undoped portion of the polycrstalline silicon layer. As described in U.S. Pat. No. 3,738,880 to A. Laker, issued June 13, 1973, entitled METHOD OF MAKING A SEMICONDUCTOR DEVICE, there are solvents in which intrinsic silicon is relatively soluble but in which P doped silicon a substantially insoluble. Such solvents include aqueous hydrazine solutions, potassium hydroxide-propanol solutions, and the like. By subjecting the polycrystalline silicon layer to such a solvent, the undoped portion will be removed, leaving the narrow strip 26 as shown in FIG. 4.

Using the narrow doped polycrystalline silicon strip 26 as a mask, the exposed portion of the silicon nitride layer 32 are removed using a suitable etchant, leaving the narrow silicon nitride layer 24 which is a part of the channel insulation. Using the silicon nitride layer 24 and the doped polycrystalline silicon strip 26 as a mask, ions of a suitable conductivity modifier are then implanted into the semiconductor body 12 on each side of the polycrystalline silicon layer to form the source and drain regions 18 and 20. Thus, the intermediate channel region 16 will be of a width corresponding to the narrow width of the polycrystalline silicon strip 26. Openings may then be provided in the silicon dioxide layer 22 over the source and drain regions 18 and 20 and the contacts 38 and 30 formed in the openings.

Thus there is provided by the present invention a MNOS memory transistor having a very narrow channel region so that electrons can be avalanched into the interface between the silicon dioxide layer and the silicon nitride layer across the entire width of the channel without requiring a conductive floating gate. In a transistor embodying the present invention, this can be achieved with the use of a relatively thick channel insulation to provide ease of making the device. In making the transistor embodying the present invention, the narrow strip of doped polycrystalline silicon 26 is used to define the narrow channel and can be removed if desired. However, by leaving the strip 26 of conductive polycrystalline silicon over the channel it can be used to determine when there is a charge in the gate insulation. Although the memory transistor 10 has been described as being formed in a silicon on sapphire device, it can also be formed on a bulk semiconductor body.

What is claimed is:
1. A MNOS memory transistor comprising:
   a body of semiconductor material having along a surface thereof a source region, a drain region, and a channel region between said source and drain regions,
   a channel insulation on said surface of the semiconductor body and over said channel region, said channel insulation including two layers of different material which are capable of storing at the interface electrons which are injected into the channel insulation, and
   said channel being sufficiently narrow in width that the electrons will be injected into the channel insulation completely across the channel region by avalanche injection.
2. A MNOS memory transistor in accordance with claim 1 in which the width of the channel is no greater than

$$Lc \leq (\epsilon \Sigma / e C_B)$$

where
   Lc = channel width,
   $\epsilon$ = the dielectric constant of the semiconductor material,
   $\Sigma$ = the critical field value for the semiconductor material,
   e = the charge on an electron,
   $C_B$ = the doping concentration in the semiconductor body.
3. A MNOS memory transistor in accordance with claim 2 in which the channel insulation includes a layer of silicon dioxide and a layer of silicon nitride.
4. A MNOS transistor in accordance with claim 3 in which the silicon dioxide of the channel insulation is on the surface of the semiconductor body and the silicon nitride layer is on the silicon dioxide layer.
5. A MNOS transistor in accordance with claim 4 in which the silicon nitride layer is only as wide as the channel region.

6. A MNOS transistor in accordance with claim 5 including a strip of conductive polycrystalline silicon on the silicon nitride layer.

7. A MNOS transistor in accordance with claim 6 in which the channel region is of one conductivity type and the source and drain regions are of the opposite conductivity type.

* * * * *